United States Patent [19]  [11]  4,358,847
Susskind  [45]  Nov. 9, 1982

[54] ELECTRICAL CIRCUIT TEST APPARATUS AND METHOD

[75] Inventor: Alfred K. Susskind, Allentown, Pa.

[73] Assignee: Lehigh University, Bethlehem, Pa.

[21] Appl. No.: 183,367

[22] Filed: Sep. 2, 1980

[51] Int. Cl.³ .................. G01R 31/28; G06F 11/00
[52] U.S. Cl. ........................................ 371/25; 371/49
[58] Field of Search ............................ 371/25, 26, 49

[56] References Cited

U.S. PATENT DOCUMENTS

| | | | |
|---|---|---|---|
| 3,582,633 | 6/1971 | Webb | 371/25 |
| 3,761,695 | 9/1973 | Eichelberger | 371/25 |
| 3,924,181 | 12/1975 | Alderson | 371/25 |
| 4,161,276 | 7/1979 | Sacher et al. | 371/25 |

OTHER PUBLICATIONS

S. C. Seth, Data Compression Techniques in Logic Testing: An Extension of Transition Counts, Journal Design Automation and Fault Tolerant Computing, vol. 1, No. 2, Feb. 1977, pp. 99–114.

Primary Examiner—Charles E. Atkinson
Attorney, Agent, or Firm—Ratner & Prestia

[57] ABSTRACT

An electrical circuit test apparatus and method are disclosed for detecting faults in n-input combinational circuitry. The testing is performed by the verification of the Walsh coefficients. This is an alternative to the usual Boolean based techniques. To implement the Walsh coefficient verification, a reversible counter is utilized in conjunction with a driving counter, a parity indicating means, and minor control circuitry. The output signal from the unit under test is compared with the parity signal derived from the driving counter, and where there is correspondence, the reversible counter is actuated in one direction. Where they are dissimilar, the reversible counter counts in the opposite direction. A circuit is considered faulty where the final indication in the reversible counter is zero.

It has been found that the Walsh spectrum of any given combination logic function f(x) of n independent variables $x_1$ to $x_n$ consists of a series of $2^n$ integer numbers, the magnitude and sign of which constitute the spectral coefficient values of f(x). Therefore, because the spectral coefficient values define the output function uniquely, the values for a network with an output fault will differ from these without fault.

8 Claims, 1 Drawing Figure

ELECTRICAL CIRCUIT TEST APPARATUS AND METHOD

FIELD OF THE INVENTION

This invention pertains to the testing of an electrical circuit and particularly to an apparatus and test method adapted to detect faults, particularly stuck-at faults at the input pins of combinational circuits by a simple method based on verification of Walsh coefficients.

BACKGROUND OF THE INVENTION

Fault detection in electrical circuits is an important factor in quality control of the manufacturing processes by which circuits of ever decreasing size and increasing complexity are manufactured in ever increasing quantities. For a general description of fault testing, including one particular approach thereto, reference may be made, for example, to U.S. Pat. No. 4,074,851—Eichelberger et al. This patent is of further interest, with respect to the present invention, for its disclosure of means for conversion from sequential circuit to combinational circuit logic to facilitate testing. The present invention is directed to apparatus and a method for testing a combinational circuit, but would find further application in the testing of a sequential circuit including such logic conversion means. U.S. Pat. No. 4,039,813—Kregness is also of interest for its disclosure of an apparatus and method for diagnosing a digital circuit wherein a test step counter is utilized in conjunction with a register, memory, and error comparator, which translates detected errors into a displayable code for maintenance isolation.

Of more specific interest with respect to the present invention is certain literature references dealing with specific input-output analyses as fault detection techniques. In this regard, reference may be made to Bennetts and Hurst, *RADEMACHER-WALSH SPECTRAL TECHNIQUES, A NEW TOOL FOR DIGITAL NETWORK FAULT DIAGNOSIS?*, Digest of Papers, Seventh Annual International Conference on Fault Tolerant Computing, IEEE Catalog No. 77CH1223-7C (1977).

Also of interest are Savir, *SYNDROME-TESTABLE DESIGN OF COMBINATIONAL CIRCUITS*, Digest of Papers, The Ninth Annual International Symposium on Fault Tolerant Computing, IEEE Publication No. 79CH1396-1C, Tzidon et al, *A PRACTICAL APPROACH TO FAULT DETECTION IN COMBINATIONAL NETWORKS*, IEEE Transactions on Computers, Volume C-27, No. 10, October, 1978, pages 968-971.

The test approach as set forth in these papers is limited as to the kinds of faults that can be detected and is therefore more restrictive in application than the present invention.

Accordingly, notwithstanding these prior art teachings, there remains a need for simplified test methods and apparatus capable of quickly detecting faults, particularly stuck-at pin faults in an electrical circuit, and particularly a need for such a test method and apparatus which is sufficiently simple to facilitate incorporation of the test circuit in the circuit to be tested.

BRIEF DESCRIPTION OF THE INVENTION

These objects are met by an apparatus and method for testing a combinational circuit having a plurality (n) of input pins by generating a plurality of electrical input signal patterns, the patterns consisting of the set of all binary numbers that can be formed from n digits. Each of these signal patterns are addressed sequentially to the input leads of the circuit to be tested and also to a parity signal generating means which emits a parity signal, either 0 or 1, indicative of whether the number of zeros in each input signal pattern is odd or even. This output of the circuit under test and the parity signal are then addressed to a reversible counter means, set at 0 to begin with, which then adds or substracts a unit in response to whether the circuit output and parity signal are both the same or different. If the parity signal is one for an even number, then the reversible counter in which the output signal and parity signal are compared adds one each time the output signal and parity signal are the same and subtracts one each time they are different. Due to the nature of Walsh coefficients describing a combinational function, in a circuit with stuck-at input faults, the final result in the reversible counter will be zero, and if not fault, it will be some other number peculiar to the function on hand.

Some combinational circuits will inherently produce a 0 when pin fault-free, but such a circuit may conveniently be modified to produce a no fault result other than zero.

If the parity signal is zero, in response to an input signal pattern having an even number of zeros, then the reversible counter subtracts one each time the parity signal and circuit output signal are the same and adds one when they are different. The same result, zero for a faulty circuit, except for certain specific circuits requiring adaptation, will be seen.

In the preferred form of the present invention, the input signal pattern generation means also includes a timing means to signal the reversible counter at the beginning of the test sequence and to zero it, and also to signal it at the conclusion of the test sequence, so that a final comparison to indicate fault or no fault, can be made at that time. In the preferred form of the present invention, the test apparatus may be incorporated as part of the circuit to be tested, in which case it is permanently attached by appropriate gating and typically mounted on the same circuit mounting means. This is particularly desirable in complex, miniaturized circuits manufactured in high quantity.

Other defects, including stuck-at lead fault defects, may be detected by similar analysis of other Walsh coefficients of the circuit. For that purpose, in the apparatus and method of the present invention, there may be incorporated a means for selecting less than all leads for parity determination and a second counter means for comparing the output signal, in response to the selected input signal patterns, to a separate parity signal generating means, generating a parity signal in response to each of the signal patterns, the result being compared to determine whether the output and the parity signal are the same or different. In this case, however, a faulty circuit may produce a number other than zero, depending on the circuit, and each circuit must be separately analyzed to determine the correct result for the subset. Still further, the same input signal generation means and parity signal generation means may be used in a separate test sequence, or plurality of sequences, to generate parity over less than all binary leads. The same reversible counter being used in each case. The nature of the fault detection technique utilizing less than all binary numbers of the input lead number is such that the final content of the reversible counter will be a predetermined number when fault-free and the criterion acceptance is whether or not that number has been accumulated.

For a better understanding of the present invention, reference may be made to the detailed description thereof which follows, taken in conjunction with the accompanying in the figures and the appended claims, wherein:

DETAILED DESCRIPTION OF THE INVENTION

This invention is described in detail with reference to the accompanying figures which are diagramatic circuit illustrations of the test apparatus and method of the present invention.

Figure 1:
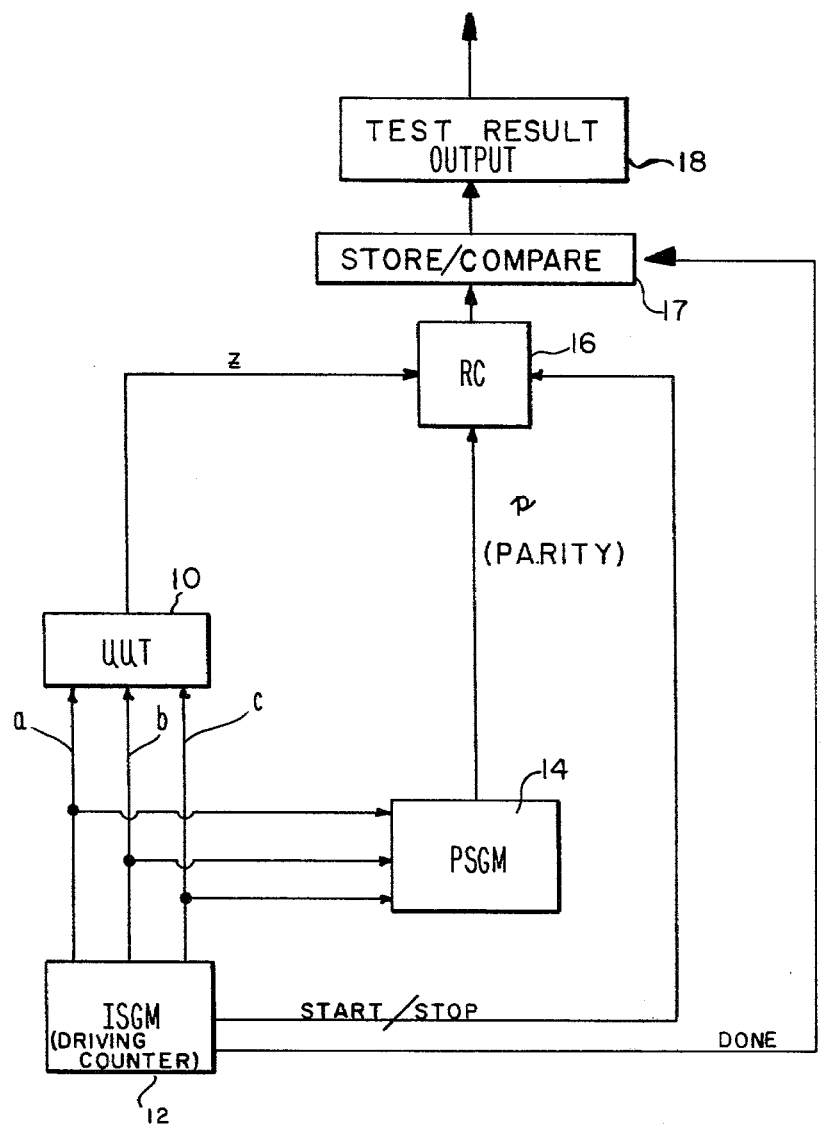
FIG. 1 is a block diagram of the preferred embodiment of the present invention.

In the FIG. 1 it is shown that an input signal generation means (ISGM), which is also called herein a driving counter, is connected for addressing input signals, of specific patterns, to a unit under test (UUT). In the diagramatic circuit illustration, the unit under test 10 includes three pins or input positions a, b and c. Input signal leads a, b and c are also connected to a parity signal generation means (PSGM) 14 which determines whether the number of zeros in a particular simultaneously generated pattern of signals in input leads a, b and c, is odd or even, in which case the parity signal generation means 14 produces an output signal, either zero or one, depending on the convention used, to a reversible counter means (RC) 16. The reversible counter 16 is also adapted to receive the output signal from the unit under test 10 and in response thereto to produce an output, indicative of whether the signal from the unit under test 10 is the same as or different than the parity signal produced by the parity signal generation means 14.

In the circuit as illustrated in FIG. 1 and in the preferred form of the present invention, the input signal generation means also called driving counter, 12 is also adapted to produce test initiation and test completion signals to the reversible counter 16, in order to zero the reversible counter 16 at the beginning of the test and to hold the reversible counter at the final resultant number, after incrementing and decrementing in the course of the test sequence. The final output is zero if there is any stuck-at fault on any input lead or any combination thereof. Additionally, other faults may manifest themselves as a zero output. Still further a fault-free circuit will produce a particular number and still other faults will manifest themselves as deviations to a number other than zero and such faults may be separately detected in the same test sequence.

By way of example and as further explanation of the underlying theory upon which the present invention is based, following is a detailed description of a particular theoretical circuit under test.

An n-input combinational circuit under test is driven by an n-bit counter, of conventional design, that a. generates all $2^n$ distinct patterns, each exactly once;

b. generates a parity signal p with value 0(1) if the present pattern of counter bits or a selected portion has an odd (even) number of zeros;

c. Signals the beginning and end of the pattern generation process.

The response z of the unit under test is scored by a reversible counter that, when in the run mode, operates in accordance with the following table:

TABLE 1

| p | z | ARITHMETIC OPERATION |
|---|---|---|
| 0 | 0 | +1 |
| 0 | 1 | −1 |
| 1 | 0 | −1 |
| 1 | 1 | +1 |

For each new number generated by the ISGM, also called the driving counter, one such arithmetic operation is performed by the reversible counter (RC). Prior to the start of the test, the driving counter causes the RC to be preset to zero and after the last number has been generated by the driving counter the contents of the RC are examined by the output or comparison circuit. In the case where p is derived from all of the bits in the driving counter 12, if the RC 16 has contents of zero, i.e., all bits of the binary output are zero, the circuit under test 10 is declared to be faulty; otherwise the circuit is declared acceptable. This represents the "$C_{ALL}$ test".

Figure 2:
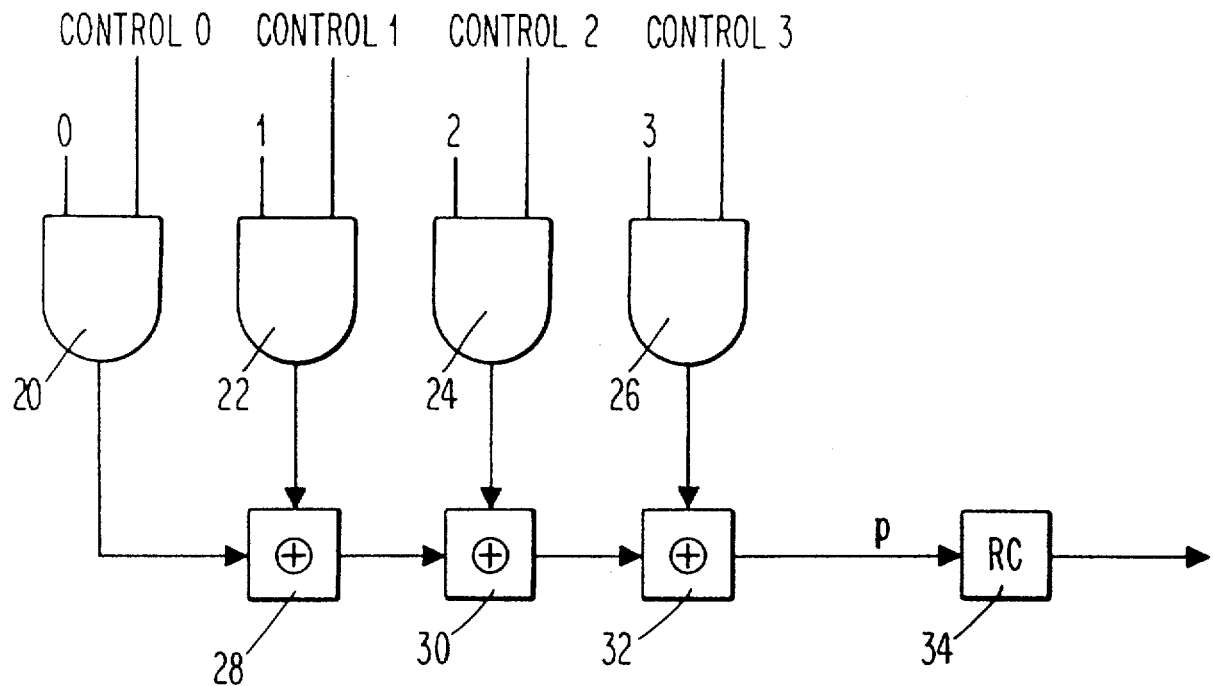
FIG. 2 is a logic diagram of the selective circuit utilized to select a subset of the input driving signals.

FIG. 2 illustrates a further extension of such test apparatus and method, where p may be derived from a proper subset of the bits control 0, 1, 2 and 3 in the driving counter, and the final contents of the RC are compared with a stored number N. If the contents of the RC differ from N, the unit under test is declared faulty. Thus, the presence of a binary 1 at control signal 3 allows the input signal 3 to pass through to the exclusive OR gate 28.

Similarly, the other signals 0, 1, and 2 will be allowed through when control signals 0, 1, and 2 are at a binary 1 level.

When p is determined by all of the bits in the driving counter, i.e., when a $C_{ALL}$ test is made, the present method of testing can be shown to detect all input stuck-at-constant-value faults (often called pin faults), in all possible combinations, singly or multiply. Moreover, since many of the possible faults in the interior circuit under test are equivalent to pin faults, this method will also detect these.

The $C_{ALL}$ test is illustrated by an example set forth in the following table, wherein the fault-free circuit is a "majority" (also called "2-out-of-3" or "voter") circuit, and the faulty unit has input c stuck-at 1.

TABLE 2

| OUTPUT OF DRIVING COUNTER a b c | RESPONSE OF FAULT-FREE UNIT P | CONTENTS OF RC | RESPONSE OF FAULTY UTT | CONTENTS OF RC |
|---|---|---|---|---|
| 0 0 0 | 0 | 0 | +1 | 0 | +1 |
| 0 0 1 | 1 | 0 | 0 | 0 | 0 |
| 0 1 0 | 1 | 0 | −1 | 1 | +1 |
| 0 1 1 | 0 | 1 | −2 | 1 | 0 |
| 1 0 0 | 1 | 0 | −3 | 1 | +1 |
| 1 0 1 | 0 | 1 | −4 | 1 | 0 |
| 1 1 0 | 0 | 1 | −5 | 1 | −1 |
| 1 1 1 | 1 | 1 | −4 | 1 | 0 |

The $C_{ALL}$ test can be used on any combinational circuit, except that a circuit which when fault free would end with the RC having a final value of zero must have its design somewhat modified. A particularly simple modification is shown in FIG. 3 and consists of the addition of a single new input q and an AND-circuit 42 such that it realizes the modified function $F^m$, defined as $$F^m(x_1,x_2,\ldots,x_n,q)=F(x_1,x_2,\ldots,x_n)\overline{q}+x_1^*x_2^*\ldots x_n^*q$$

Here F is the n-variable function that the original circuit 40 was intended to realize and $x_i^*$ denotes either $x_i$ or $\overline{x}_i$. When $q=0$, $F^m=F$, and this is the mode in which the circuit is used for its normal application. In testing, however, the terminal q is made to take on both the value 0 and the value 1. Thus the driving counter 12 has $n+1$ stages for testing an n-input modified logic block.

For internal stuck-at lead-fault detection, a scheme shown in the FIG. 2 is used and the detection of these faults can be made concurrently with the detection of pin faults. Typically, the same driving counter is used, a second reversible counter may be added, as the orginal one sequentially used, and its odd-even terminal is controlled by a second p signal that is derived from a proper subset of the bits in the driving counter.

Figure 3:
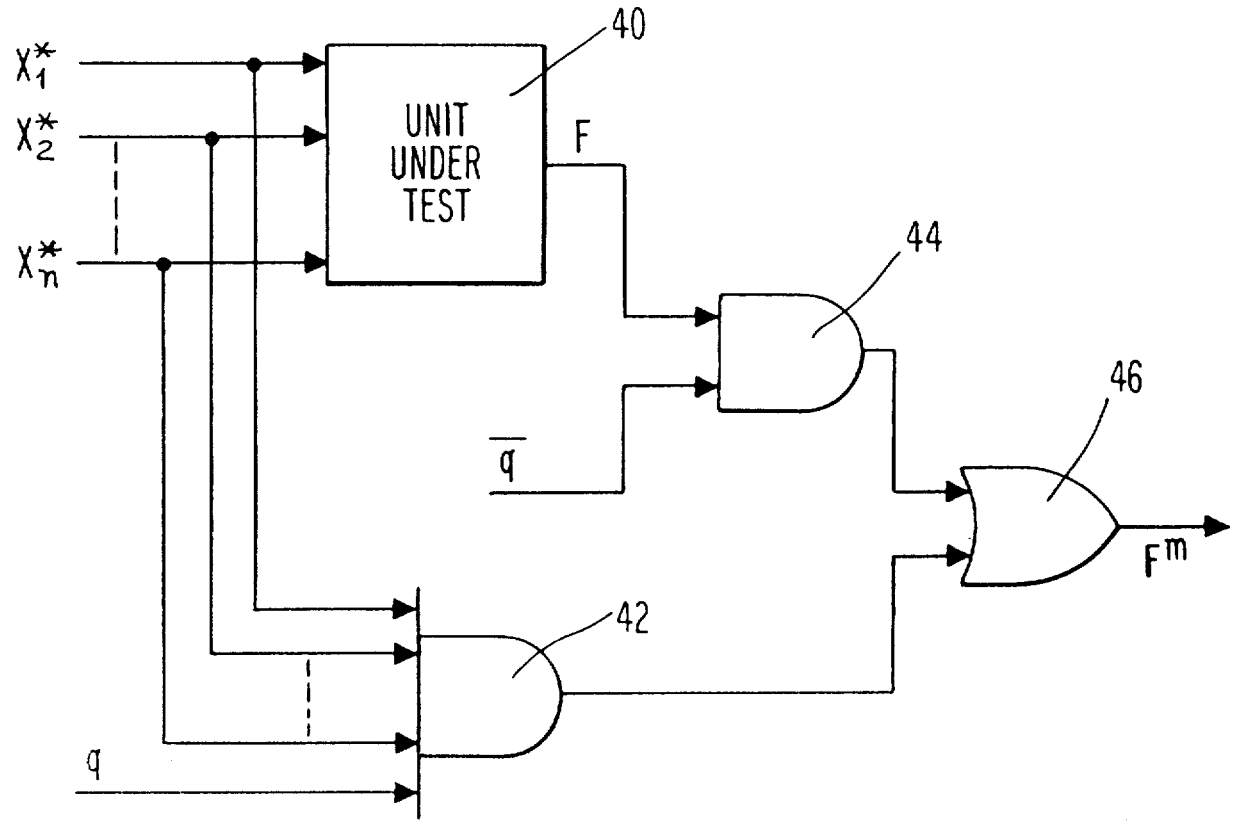
FIG. 3 is also a logic diagram of the modified circuit which is used when the unit under test inherently produces a zero when the input pins are fault free.

In general, it can be seen that the apparatus and method of the present invention are relatively simple, test preparation requires negligible effort and for pin fault detection, one merely needs to determine in the parts design process if F, the object function, needs to be modified into $F^m$, as specified above as shown in FIG. 3. The cost of the modification, if needed, is small and for purposes of defining the present invention, an "n input combinational circuit" is considered to be only an input combinational circuits in which $C_{ALL}$ is not zero when fault free, otherwise the circuit is modified to one where $C_{ALL}$ of $F^m$ is not zero and the n input pins thereafter consist of $n+1$, as compared to the unmodified circuit. Thus any combinational circuit may be tested directly or simply adapted for testing in accordance with the present invention.

Also, because of the simplicity of the apparatus and method of the present invention, the test components may easily be built into miniaturized circuits, and most particularly into integrated circuit chips at modest cost. Thus the technique offers a feasible means for built-in-test circuitry.

In the case of pin fault detection, the validity of the test procedure is shown to depend only on the function mechanized. In the case of internal leads, it also depends on the structure of the internal fan-out of the circuit. Accordingly, the method of the present invention is substantially independent of the detailed gate implementation and device technology used.

All networks with n or less input pins may be tested in accordance with the present invention with the same equipment having an n bit lay-out, and this one set of equipment may be time shared by a multiplicity of circuits located on a given chip or circuit board.

Where the present invention is used for a built-in test, it will be evident that the test components are permanently connected to (via appropriate gating) and typically mounted on a common circuit mounting means with the circuit or circuits to be tested.

It should be noted that the sequence in which the sequentially generated input signal patterns are generated is irrelevant, so that a variety of counter types may be used for generating this plurality of input signal patterns (i.e., polynominal binary, Gray code, etc.). Similarly, linear feedback shift registers with maximum cycle lengths may be used, providing provision is made to generate the all zero bit pattern. This may be advantageous in built-in test implementations where the LSSD (also called scan-in/scan-out) design approach is used, because the shift registers are already available.

The present method of testing is based on the verification of so-called Walsh coefficients. That is, the test determines whether or not the function realized by the network on hand has the same partial "Walsh spectrum" as the nominal function. A Walsh spectrum of a function of n variables consists of $2^n$ coefficients that can be made complete, so that the set of Walsh coefficients can be made to uniquely represent the given function. Thus the Walsh spectrum is similar to the Fourier spectrum and both are examples of transformations. In the case of Walsh spectra, however, there is no physical interpretation similar to harmonics; the coefficients are merely numbers.

For purposes of comparison, reference may again be made to the Tzidon et al article referred to above. The approach there described differs from the test method and apparatus disclosed herein, in that it essentially tests a circuit output with a similar sequence of input test signals but without parity determination.

Industrial Application of the Invention

As will be apparent, the present invention is deemed to have significant utility in the rapid and efficient testing of an electrical circuit based on combinational logic, either in unmodified form or modified to a minor degree so as to adapt the circuit for test in accordance with the present invention. Moreover, this test method and apparatus is sufficiently simple to be adapted for integration as part of the circuit to be tested.

I claim:

1. Apparatus for testing an n-input combinational circuit comprising
   (a) an input signal pattern means for generating a plurality of electrical input signal patterns, said plurality consisting of the set of all binary numbers that can be formed from n digits, said means adapted to address each of said signal patterns sequentially to the input leads of a circuit to be tested,
   (b) a parity signal generating means for emitting a parity signal responsive to each input signal pattern generated by said input signal means, said parity signal being 0 to 1 and being indicative of whether the number of zeros in each of said input signal patterns is odd or even,
   (c) reversible counter means adapted to receive from a circuit under test, an output signal either 0 or 1 for each input signal pattern addressed thereto and comparing the corresponding parity signal therewith, said reversible counter means including arithmetic scoring means for cumulatively either
      (1) if said parity signal is one for an even number of zeros in an input signal pattern, adding a one each time said output signal and parity signal are the same, subtracting a one each time they are different, or
      (2) if said parity signal is 0 for an even number of zeros in an output signal pattern, adding a one each time said output signal and parity signal are different and substracting a one each time they are the same.

2. Apparatus, as recited in Claim 1, further including means connected between the input signal pattern means and the reversible counter means for zeroing said reversible counter means prior to activation of said input signal means and for holding and signaling as an output, the cumulative result of said adding and subtracting in said reversible counter after said input signal means has generated all of said plurality of input signal patterns.

3. Apparatus, as recited in claim 1, further including a selection means for selecting a predetermined subset of input leads consisting of less than all of said input leads and for signaling an additional reversible counter with selected parity signals corresponding to said predetermined lead subset, said additional reversible counter means including means for comparing said selected parity signals with the corresponding circuit output signals and arithmetic scoring means for cumulatively either
   (1) if said parity signal is one for a number of zeros in an input signal pattern, adding a one each time said output signal and parity signal are the same, subtracting a one each time they are different, or
   (2) if said parity signal is 0 for an odd number of zeros in an output signal pattern, adding a one each time said output signal and parity signal are different and subtracting a one each time they are the same.

4. Apparatus, as recited in claim 3, wherein said additional reversible counter is the same as said first reversible counter, said apparatus further including sequencing means for the separate sequential use of said reversible counter as said first and said additional counter.

5. Apparatus, as recited in claim 1, further including test result indicating means, responsive to a 0 signal from said reversible counter at the conclusion of the test, for indicating that a circuit under test is indicated to be defective.

6. Apparatus, as recited in claim 5, further including test result indicating means for comparing the number result in said second reversible counter at the conclusion of the test with a predetermined correct test result number and for indicating, in response thereto, that a circuit under test is indicated to be defective or not defective.

7. Apparatus, as recited in any of claims 1 to 6, wherein said apparatus comprises an electrical test circuit permanently attached to and sharing a common mounting with a second circuit adapted to be tested by said first circuit.

8. Method for testing an n-input combinational circuit comprising
   (a) sequentially generating and addressing to the n-input leads of a circuit under test, a plurality of electrical input signal patterns consisting of a set of all binary numbers that can be formed from n digits,
   (b) generating a parity signal corresponding to each of said input signal patterns, said parity signal being 0 to 1,
   (c) comparing the output of said circuit to the parity signal for each corresponding input signal and either incrementing or decrementing a reversible counter, and
   (d) examining the reversible counter at the conclusion of the test and determining that the circuit is acceptable or not acceptable on the basis of the counter contents.

* * * * *

UNITED STATES PATENT AND TRADEMARK OFFICE
CERTIFICATE OF CORRECTION

PATENT NO. : 4,358,847              Page 1 of 2
DATED     : 11/9/82
INVENTOR(S) : Alfred K. Susskind It is certified that error appears in the above—identified patent and that said Letters Patent is hereby corrected as shown below:

Col. 4, line 38, change "28" to --32--.
Col. 5, line 10, in the equation, change "$x_1^*$" to --$x_i^*$--.
Col. 5, line 24, change "as" to --or--.
Col. 7, line 21, Claim 3, change "a" to --an even--.

The sheet of drawing containing Figures 2 and 3 should be added as per attached sheet.

Signed and Sealed this

Fifth Day of April 1983

[SEAL]

Attest:

GERALD J. MOSSINGHOFF

Attesting Officer    Commissioner of Patents and Trademarks